United States Patent [19]

Kadija et al.

[11] Patent Number: 4,490,218
[45] Date of Patent: Dec. 25, 1984

[54] PROCESS AND APPARATUS FOR PRODUCING SURFACE TREATED METAL FOIL

[75] Inventors: Igor V. Kadija, Cheshire; James E. Oxley, New Haven, both of Conn.

[73] Assignee: Olin Corporation, New Haven, Conn.

[21] Appl. No.: 549,102

[22] Filed: Nov. 7, 1983

[51] Int. Cl.³ .................. C25D 1/04; C25D 17/00
[52] U.S. Cl. ................................ 204/13; 204/40; 204/216; 204/231
[58] Field of Search ............. 204/13, 40, 231, 208, 204/216

[56] References Cited

U.S. PATENT DOCUMENTS

| | | | |
|---|---|---|---|
| Re. 30,180 | 12/1979 | Wolski et al. | 428/601 |
| 3,220,897 | 11/1965 | Conley et al. | 204/13 |
| 3,293,109 | 12/1966 | Luce et al. | 204/13 |
| 3,585,010 | 6/1971 | Luce et al. | 29/191.2 |
| 3,674,656 | 7/1972 | Yates | 204/13 |
| 3,699,018 | 10/1972 | Carlson | 204/52 R |
| 3,799,847 | 3/1974 | Vladimirovna et al. | 204/13 |
| 3,857,681 | 12/1974 | Yates et al. | 29/195 |
| 3,901,785 | 8/1975 | Vladimirovna | 204/208 |
| 3,918,926 | 11/1975 | Wolski et al. | 29/195 |
| 4,049,481 | 9/1977 | Morisaki | 156/151 |
| 4,053,370 | 10/1977 | Yamashita et al. | 204/13 |
| 4,082,591 | 4/1978 | Morisaki et al. | 156/150 |

FOREIGN PATENT DOCUMENTS

| | | |
|---|---|---|
| 112145 | 3/1975 | Fed. Rep. of Germany . |
| 134785 | 3/1979 | Fed. Rep. of Germany . |
| 1371510 | 7/1964 | France . |
| 37-18870 | 12/1962 | Japan . |
| 8202991 | 9/1982 | PCT Int'l Appl. ........... 204/13 |
| 928267 | 6/1963 | United Kingdom . |
| 1211494 | 11/1970 | United Kingdom ......... 204/13 |
| 1349696 | 4/1974 | United Kingdom ......... 204/13 |
| 1424129 | 2/1976 | United Kingdom ......... 204/13 |
| 1543301 | 4/1979 | United Kingdom ......... 204/13 |
| 1548550 | 7/1979 | United Kingdom ......... 204/13 |

Primary Examiner—Thomas Tufariello
Attorney, Agent, or Firm—Barry L. Kelmachter; Howard M. Cohn; Paul Weinstein

[57] ABSTRACT

A process and apparatus for producing surface treated metal foil is described. The process comprises plating a relatively smooth metal foil onto a cathodic surface and thereafter forming a dendritic layer on the foil and firmly bonding it thereto while the foil is still on the cathodic surface. In one embodiment, the apparatus comprises an electrolytic cell containing an electrolyte, a rotating drum cathode at least partially immersed in the electrolyte, at least two primary anodes and a plurality of treatment anodes embedded in one of the primary anodes.

21 Claims, 3 Drawing Figures

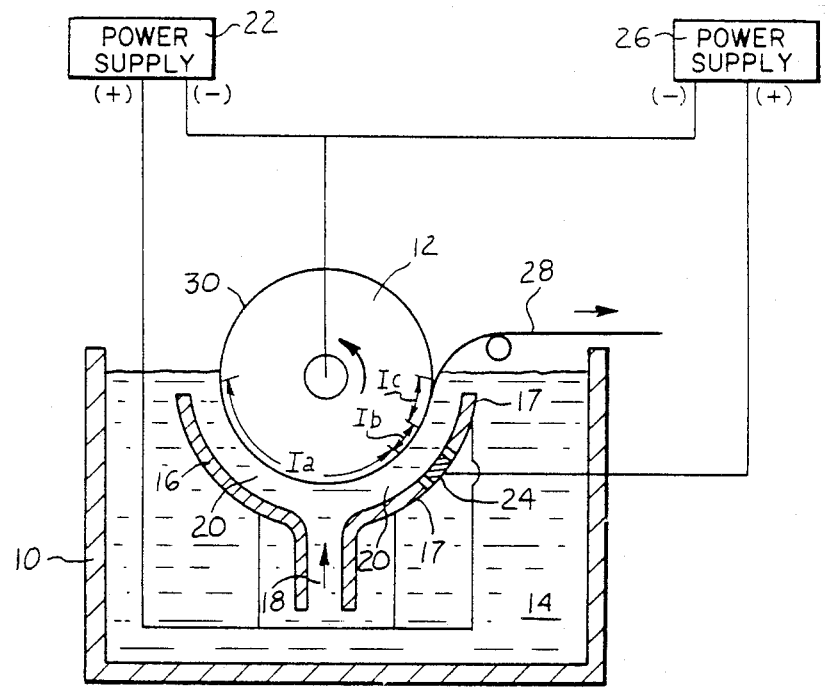
Fig-1
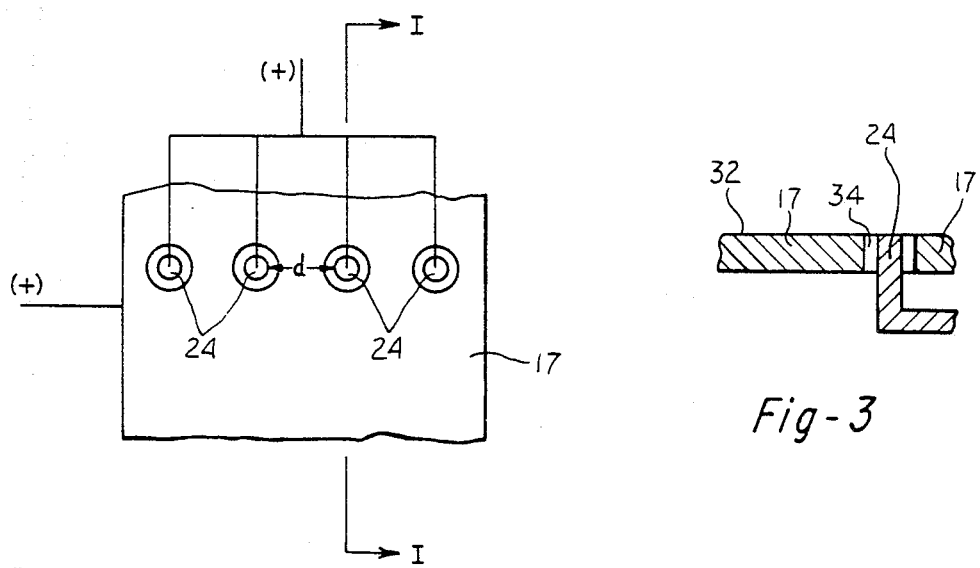
Fig-2
Fig-3

PROCESS AND APPARATUS FOR PRODUCING SURFACE TREATED METAL FOIL

This invention relates to the electrolytic production of nodularized metal foil.

Printed circuits are widely used in various electronic devices such as radios, televisions and electronic computers. In the production of printed circuits, it is desirable to use copper, particularly in foil form, because of copper's high electrical conductivity. Furthermore, where copper foil is carefully made and contains minimal elemental impurities, electrical conductivity is very uniform over the extent of the electrical connection between two points.

During the production of printed circuits, it is necessary to bond the copper foil to a suitable substrate material, for example fiberglass epoxy in the case of rigid circuit boards or polyimides in the case of flexible circuit boards. Thereafter, the composite structure is subjected to an acid etching treatment to form the desired circuit. It has been found in those composite structures having untreated copper foil bonded to the substrate that the adhesion between the metal foil and the substrate is weak. Consequently, considerable effort has been directed to developing techniques for treating the copper foil prior to the lamination process so as to increase its bond strength.

Most treatment techniques involve forming at least one roughened surface on the copper foil so that when the copper foil is coated with a hardenable plastic material, the roughened surface forms a tenacious mechanical bond. The treatments generally comprise electrodepositing a nodularized or dendritic layer on a surface of the copper foil. U.S. Pat. Nos. 3,220,897 to Conley et al., 3,293,109 to Luce et al., 3,585,010 to Luce et al., 3,699,018 to Carlson, 3,857,681 to Yates et al., 3,918,926 to Wolski et al., 4,049,481 to Morisaki et al., 4,082,591 to Morisaki et al. and Re. 30,180 to Wolski et al., French Pat. No. 1,371,510, German Democratic Republic Patentschrift Nos. 112,145 and 134,785, U.K. Pat. Nos. 928,267, 1,211,494, 1,349,696 and 1,424,129 and PCT Publication No. WO82/02991 illustrate some of the treatments applied to copper foil.

One problem associated with the prior art treatments is the tendency to produce powdery nodular deposits or dendrites that easily break off during subsequent lamination operations. In an attempt to deal with this problem, some of the surface treatments include the application of an encapsulation or locking layer over the nodular or dendritic surface layer. The encapsulation layer is electrodeposited onto the dendritic treatment and does not itself have a nodular structure. Rather, it tends to conform to the configuration of the dendritic layer and tends to have a substantially uniform thickness. The encapsulation layer may be formed from copper, nickel, cobalt, chromium or another suitable material.

A technique for surface treating metal foil that does not produce powdery nodular deposits and does not require an encapsulation layer is illustrated in allowed co-pending U.S. patent application Ser. No. 460,630, filed Jan. 24, 1983, to Polan et al. In this technique, a multi-cycle fluctuating current is used to simultaneously form a dendritic surface structure and bond it to an underlying base metal sheet or foil. The fluctuating current comprises a cathodic current having regularly recurring pulses. During each pulse, there is a first portion having a current density greater than the limiting current density and a second portion having a magnitude less than the limiting current density but greater than zero.

Another problem associated with the prior art treatments is their overall system inefficiency. Typically, the foil formation and the surface treatment processes are performed as separate operations using separate apparatuses. While it is desirable to perform the surface treatment or treatments in-line with the foil formation process, it generally is impractical to do so because foil line speeds are generally not compatible with treatment line speeds. Typical line speeds for foil treatment lines are in the range of 15–20 ft./min. whereas line speeds for E-D foil production lines are generally in the range of 2–4 ft./min.

Primarily in response to the latter problem, there have been suggested in the prior art various techniques for applying a dendritic surface treatment to electrodeposited copper foil while the copper foil is still on the rotating plating drum or endless surface on which the foil is formed. U.S. Pat. Nos. 3,674,656 to Yates, 3,799,847 to Vladimirovna et al. and 4,053,370 to Yamashita et al., Japanese Pat. No. 37-18870 and U.K. Pat. Nos. 1,543,301 and 1,548,550 illustrate such various rotary drum approaches. However, here again, the dendritic surface treatments tend to be powdery. In addition, the dendrites produced on the foil tend to be only lightly anchored to the base metal foil and can often be broken off during subsequent laminating operations.

In accordance with the present invention, a process and apparatus for forming a firmly-bonded or well-locked dendritic layer on an electrodeposited base metal foil while the foil is still on an endless surface cathode, e.g. a rotating plating drum, is provided. It is believed that the process and apparatus of the present invention provide overall system advantages as well as product quality advantages. For example, by forming the dendritic layer on and firmly bonding it to a freshly-plated high energy surface, i.e. while the foil is still at cathodic potential, improved product quality should result.

Briefly, the process of the present invention comprises the steps of electrolytically depositing a base metal foil onto an endless surface cathode that is at least partially immersed in an electrolyte solution and thereafter, while the electrodeposited metal foil is still on the cathode, substantially simultaneously electrolytically depositing and bonding a layer of metallic dendrites onto the metal foil. The dendrites are preferably formed and bonded to the metal foil by superimposing a current density in excess of the limiting current density over a base plating current density that is less than the limiting current density.

In a preferred embodiment, the apparatus of the present invention comprises an electrolytic cell having a rotating drum cathode and at least one insoluble, arcuate primary anode substantially concentric with the rotating drum cathode. At least one treatment anode for applying the current density needed to form the plurality of dendrites on the metal foil is embedded in a portion of a primary anode. In a preferred construction, a plurality of spaced-apart treatment anodes are embedded in said anode portion. The treatment anodes are embedded in such a manner that a substantially smooth anode face all portions of which are substantially equidistant from the face of the rotating drum cathode is formed. In order to superimpose the current needed to form the dendrites over the base plating current, the primary and treatment anodes are connected to separate power supplies.

In operation, electrolyte is pumped through a central opening or openings provided in the anode structure and into a gap between the primary anode or anodes and the rotating drum cathode. The current applied to each primary anode causes metal from the electrolyte to be deposited onto the cathode surface. Since the base current density generated by each primary anode is less than the limiting current density, a relatively smooth, substantially uniform layer of metal will be formed on the cathode surface. In a treatment zone, the electrolyte and metal foil are substantially simultaneously subjected to a current density in excess of the limiting current density and the base current density. The current density in excess of the limiting current density causes a plurality of dendrites to nucleate on the metal foil at a plurality of sites. The base current density being applied substantially at the same time is believed to cause a non-dendritic metal plating over substantially the entire structure. This non-dendritic plating has the effect of firmly bonding each dendrite to the metal foil.

Unlike some prior art systems, the process of the present invention does not require separate electrolyte feeds for the plating and treatment zones, isolation of the treatment zone from the plating zone, and the maintenance of quiescent conditions in the treatment zone. In fact, the same electrolyte solution is used during all fabrication stages. The solution is well agitated during each stage to provide fresh metal ion species at the cathode surface and to obtain improved control over the plating process.

It is an object of the present invention to provide an improved process for fabricating treated metal foil having improved bondability.

It is a further object of the present invention to provide a process as above having improved system advantages.

It is a further object of the present invention to provide a process as above for forming a wellbonded dendritic surface on metal foil.

It is a further object of the present invention to provide a relatively simple and efficient apparatus for performing the above process.

These and other objects, features and advantages will become apparent from the following description and drawings in which like reference numerals designate like elements.

FIG. 1 is a schematic illustration in partial cross section of the apparatus of the present invention.

FIG. 2 is a schematic illustration of a portion of an anode construction in accordance with the present invention.

FIG. 3 is a sectional view taken along lines I—I in FIG. 2.

In accordance with this invention, a process and apparatus for electrolytically forming a surface treated metal foil having improved ability to be bonded to a substrate, particularly a non-metallic substrate, are provided. While the following description describes the invention in the context of forming and treating copper foil, the process and apparatus of the present invention have utility in forming and treating other metals.

Referring now to the figures, the apparatus comprises an electrolytic cell having a tank 10 formed from a suitable inert material such as lead or stainless steel. If desired, the tank 10 may be formed from an appropriate non-conducting material such as concrete and lined with a metal, such as lead or stainless steel, or a non-metallic material such as polyvinylchloride or rubber. In the center of the tank, a drum cathode 12 is mounted for rotation by suitable conventional mounting means not shown. The drum cathode may be formed from any suitable electrically conductive metal or metal alloy including lead, stainless steel, columbium, tantalum, titanium and alloys thereof. In a preferred construction, the drum cathode comprises a stainless steel drum having a polished plating surface formed from titanium, columbium, tantalum or an alloy thereof. The drum cathode 12 may be rotated by any suitable motor drive arrangement (not shown) known in the art.

The drum cathode 12 is mounted in the tank 10 so that it is at least partially immersed in an electrolyte solution 14. In a preferred arrangement, about half of the drum cathode extends beneath the surface of the electrolyte 14.

The electrolyte 14 generally comprises an acidic solution containing a concentration of ions of a metal to be electrodeposited. For example, where copper is to be electrodeposited, the electrolyte 14 contains a concentration of copper ions. In a preferred embodiment for forming nodularized copper foil or coral copper using the apparatus of the present invention, the electrolyte 14 comprises a copper sulfate-sulfuric acid solution. During operation, the solution is preferably maintained either substantially at room temperature or at a slightly elevated temperature. When maintained substantially at room temperature, the solution has a concentration of copper, preferably in the form of copper sulfate, of about 10 grams/liter, hereinafter g/l, to about 60 g/l, preferably from about 15 g/l to about 40 g/l. The sulfuric acid can be present in the electrolyte 14 in a concentration up to that which causes copper to precipitate out as copper sulfate. In a preferred embodiment, the concentration of sulfuric acid for an electrolyte substantially at room temperature is from about 10 g/l to about 100 g/l.

It should be recognized that the aforementioned copper sulfate and sulfuric acid concentrations are dependent upon the electrolyte temperature. If desired, the tank 10 may be provided with means not shown for maintaining the electrolyte temperature at a desired level. The temperature maintaining means may comprise any suitable means known in the art such as a heating and/or cooling loop. The copper sulfate and sulfuric acid concentrations may be adjusted if the electrolyte temperature is other than about room temperature. At elevated temperatures, the copper sulfate concentration range may be increased beyond the aforementioned concentration range because its solubility limit increases with temperature. If desired, a proteinaceous material such as gelatin and/or a suitable surfactant may be added as is known in the art to the copper sulfate-sulfuric acid electrolyte to further facilitate the surface treatment process.

At least one arcuate insoluble primary anode may be mounted in the tank 10 in close proximity to the rotating drum cathode 12. The primary purpose of the anode or anodes is to plate onto the drum surface 30 a relatively smooth deposit of metal from the electrolyte 14. While any number of primary anodes may be used, it is preferred as shown in FIG. 1 to use two arcuate anodes 16 and 17. It is also preferred to arrange the primary anodes 16 and 17 substantially concentric with the rotating drum cathode 12 and to space each anode from the drum surface 30 by a distance of about 5 mm. to about 25 mm. Most preferably, each anode is spaced from the drum surface 30 by a distance in the range of about 7 mm. to about 15 mm. The primary anodes 16 and 17 may be mounted in the tank 10 by any suitable conventional mounting device or devices not shown.

As well as being arranged in close proximity to the rotating drum cathode 12, the primary anodes 16 and 17 are arranged with respect to each other to form an electrolyte passageway 18. During the fabrication process, the electrolyte is caused to flow through the passageway 18 and into the gaps 20 between the primary anodes 16 and 17 and the drum surface 30 by a pump not shown. Any suitable pump known in the art may be used to create this electrolyte flow. If desired, a manifold not shown may be mounted in the tank 10 adjacent the lower portion of the passageway 18 to assist in distributing electrolyte to the passageway 18.

The primary anodes 16 and 17 may be formed from any suitable electrically conductive material known in the art. For example, they can be formed from lead, antimony, platinum or alloys thereof. Both anodes 16 and 17 are electrically connected to a common power supply 22. Any suitable electrical connection can be made between the power supply 22 and anodes 16 and 17. The operation of the primary anodes 16 and 17 during the fabrication process shall be discussed below.

In accordance with a preferred embodiment of the present invention, a zone Ib for applying a dendritic layer to the electrodeposited foil is created by embedding at least one treatment anode 24 in a portion of the anode 17. Typically, a plurality of spacedapart treatment anodes 24 are embedded in the anode 17. So that each treatment anode 24 may be electrically insulated from the anode 17, an air gap 34 or a suitable dielectric material not shown completely surrounds each treatment anode and separates it from the anode 17. Where a dielectric material is used, any suitable dielectric material known in the art may be utilized.

To facilitate electrolyte agitation during all fabrication stages, each treatment anode 24 is embedded in the anode 17 in such a manner that a substantially smooth anode face 32, all portions of which are substantially equidistant from drum surface 30, is formed. The number of treatment anodes 24 and the diameter of each anode 24 would of course depend upon the area of the metal foil to be treated at one instant. The diameter of each anode 24 is preferably about ½ of the spacing between the drum face 30 and the anode face 32. The spacing d between each treatment anode 24 is preferably from about 1 to about 3 times the gap between the anode surface and the drum surface. Most preferably, the spacing between treatment anodes is from about 1.0 to about 2.5 times the gap between the anode and cathode surfaces 32 and 30, respectively.

Each treatment anode 24 is electrically connected to a power supply 26 that is separate and distinct from the power supply 22. By employing different power supplies for the primary and treatment anodes, it is possible, for reasons to be explained hereinafter, to simultaneously generate different current densities in the treatment zone. The anode or anodes 24 may be connected to the power supply 26 in any suitable fashion known in the art.

Any suitable power supply known in the art may be used for power supplies 22 and 26. For example, each power supply could be a rectifier for applying a DC current or a variable power supply having means for generating a current having a regularly recurring pulse wave such as a sine wave, a square wave, a triangular wave or any other desired waveform.

During operation of the apparatus of the present invention, the electrolyte 14 is pumped into the passageway 18 and the gaps 20 between the primary anodes 16 and 17 and the rotating drum cathode 12 at a desired flow rate. A first current sufficient to generate a desired base current density is applied to the primary anodes 16 and 17 by power supply 22. As previously discussed, the base current density should be below the limiting current density. As a result of the current applied to the primary anodes, metal from the electrolyte 14 is deposited onto the drum surface 30 in the plating zone Ia. Since the base current density is preferably less than the limiting current density, a relatively smooth metal deposit having a substantially uniform thickness, e.g. a metal foil, forms on the drum surface 30.

Just prior to the electrodeposited metal foil initially entering the treatment zone Ib, a second current is applied to the treatment anode or anodes 24. The second current should be sufficient to generate in the treatment zone Ib a second current density greater than the limiting current density. If desired, the second current may be a pulsed current having a first portion during which the second current density is greater than the limiting current density and a second portion during which the second current density is less than the limiting current density. While the second current is being applied to the anode or anodes 24, the first current is preferably still being applied to the anode 17 in which the treatment anode or anodes 24 are embedded. This will have the effect of superimposing the second current density over the base current density in the treatment zone Ib.

When the second current density is greater than the limiting current density, metal from the electrolyte will be deposited onto the metal foil as a plurality of dendrites. Generally, the dendrites are formed at a plurality of spaced locations. Since the base current density is also being applied in the treatment zone, it is believed that an additional non-dendritic metal deposit is formed. This additional metal deposit is believed to occur over substantially all of the foil surface and has the effect of firmly bonding the dendrites to the metal foil. As can be seen from the foregoing discussion, the process of the present invention provides in the treatment zone substantially simultaneous formation of a plurality of dendrites and a locking plating for firmly bonding the dendrites in place.

Although it is not absolutely necessary, the anode 17 may extend beyond the treatment zone Ib so as to form a further plating zone Ic. In this zone, more metal from the electrolyte 14 can be plated onto the treated metal foil. Since the only current density being applied in this zone is the base current density, the metal deposit tends to be non-dendritic and substantially conforms to the shape of the dendritic layer. The effect of this additional metal deposit will be to further bond the dendrites to the metal foil. It is believed that the metal deposit in this zone will essentially be an encapsulating layer having a substantially uniform thickness across the width of the treated metal foil.

For forming treated copper foil or coral copper using the copper sulfate-sulfuric acid electrolyte solution previously discussed, the electrolyte 14 should flow through the passageway 18 and the gaps 20 at a flow rate in the range of about 1 m/sec to about 4 m/sec, preferably from about 1 m/sec to about 2.5 m/sec. The base current density should be from about 0.4 A/cm$^2$ to about 2 A/cm$^2$, preferably from about 0.75 A/cm$^2$ to about 1.5 A/cm$^2$. In the treatment zone, the second current density superimposed over the base current density should be from about 1.1 A/cm$^2$ to about 6 A/cm$^2$, preferably from about 2 A/cm$^2$ to about 3 A/cm$^2$.

After processing has been completed, the treated metal foil 28 may be removed from the drum cathode 12 in any suitable manner known in the art. For example, a knife blade not shown may be used to strip the treated foil from the drum cathode. Thereafter, the foil may be rinsed, dried, slit to size, rolled on to a take-up reel not shown, and subjected to one or more additional treatments, such as an anti-tarnishing treatment, if so desired.

While the cell of FIG. 1 has been shown as having two primary anodes 16 and 17 forming a central fluid passageway 18, a single insoluble arcuate anode not shown may be used in lieu of the anodes 16 and 17. If a single anode is used, one or more openings should be provided in the central portion of the anode to permit electrolyte flow into the gap between the rotating drum surface and the anode surface. Of course, the treatment anode or anodes would be embedded as before in that portion of the primary anode forming the treatment zone.

While the invention has been described in terms of a continuous treated foil production system, the treated metal foil may also be produced in a batchwise fashion if it is so desired. In such a batchwise system, a pulsed current applied to a portion of at least one primary anode could be used in lieu of the treatment anode or anodes 24 to apply the dendritic treatment to the foil. The pulsed current has a first portion during which a first current density in excess of the limiting current density is produced and a second portion during which a second current density less than the limiting current density is produced. Prior to the application of the pulsed current, a metal foil is electrodeposited in a conventional manner on a moving cathodic surface immersed in an electrolyte. The pulsed current is then applied for a relatively short time period as compared to the time period needed to produce the metal foil to apply the dendritic treatment to the metal foil.

The process of the present invention provides high quality copper foil well adapted for use in printed circuit applications. Bond strengths in the range of about 11 lb/in to about 13 lb/in are attainable using the instant technique.

One of the advantages of the process of the present invention is that the electrolyte is agitated in each plating and treatment zone. In addition, fresh metal species are substantially always being presented to the plating surface. Since there are no impediments to electrolyte flow in any of the zones, Ia, Ib or Ic, the electrolyte flow rate should be substantially the same in each zone. It is believed that this will permit improved control over the plating process. In those systems having a barrier separating the plating and treatment zones, it may not be possible to effectively control the plating process. Undefined conditions of mass transport resulting in the formation of powdery deposits weakly bonded to the base metal foil may be present in the treatment zone.

Another advantage of the present process is its simplicity. For example, there is no need to provide separate electrolyte feeds to the plating and treatment zones.

The treated metal foil produced by the present invention may be laminated to an appropriate substrate. As will be apparent, the particular substrate used in the laminate will vary depending upon the use for which the laminate is intended and the service conditions under which the laminate will be used. Particularly appropriate substrates include polytetrafluoroethylene-impregnated fiberglass, polyimides, fiberglass impregnated by certain fluorocarbon products including polymers of trifluorochloroethylene and certain copolymers, and the like. If needed, an adhesive may be used to bond the treated foil to the substrate. Any suitable conventional technique known in the art may be used to bond the treated foil to the substrate.

While the preferred embodiment of the invention has been described in connection with the production of treated copper foil, the technique of the present invention is equally applicable to the electrodeposition of other metals including but not limited to lead, tin, zinc, iron, nickel, gold and silver. Of course, the type of electrolyte, the metal and acid concentrations in the electrolyte, the flow rate, and the current densities used will have to be altered in accordance with the metal being plated.

While the cathode for the plating apparatus has been described as being a rotating drum cathode, it is possible to perform the process of the present invention using an endless belt-type cathode.

While only one row of treatment anodes has been illustrated in FIG. 1, it is possible to employ a plurality of rows of treatment anodes.

While the treatment anodes have been illustrated as having a round shape, they may also have square, oval, elongated or any other suitable shape.

The patents, patent application and foreign patent publications set forth in the specification are intended to be incorporated by reference herein.

It is apparent that there has been provided in accordance with this invention a process and apparatus for producing surface treated metal foil which fully satisfies the objects, means and advantages set forth hereinbefore. While the invention has been described in combination with specific embodiments thereof, it is evident that many alternatives, modifications, and variations will be apparent to those skilled in the art in light of the foregoing description. Accordingly, it is intended to embrace all such alternatives, modifications and variations as fall within the spirit and broad scope of the appended claims.

We claim:

1. A process for producing surface treated metal foil, said process comprising:
   providing an electrolytic cell having an electrolyte and a cathodic surface immersed in said electrolyte, said electrolyte containing a concentration of metal ions;
   applying a first current density in a first zone for plating a relatively smooth metal foil deposit on said cathodic surface; and
   superimposing a second current density having a magnitude greater than the limiting current density over said first current density in a second zone, said second current density forming a plurality of dendrites on said metal deposit and said first current density plating an additional metal deposit on said metal foil for firmly bonding said dendrites to said metal foil in said second zone.

2. The process of claim 1 further comprising:

providing at least one insoluble primary anode in said cell; and said superimposing step comprising:
(a) embedding at least one treatment anode in said at least one primary anode;
(b) applying a first current to said at least one primary anode; and
(c) simultaneously applying a second current to said at least one treatment anode.

3. The process of claim 2 further comprising:
embedding a plurality of treatment anodes in said at least one primary anode; and
applying said second current to each said treatment anode.

4. The process of claim 2 further comprising:
agitating said electrolyte in said first and second zones.

5. The process of claim 4 further comprising:
providing at least two primary anodes in said cell;
spacing said primary anodes from said cathodic surface and from each other so as to form a space between each said primary anode and said cathodic surface and at least one fluid passageway; and
said agitating step comprising flowing said electrolyte at a desired rate through said at least one fluid passageway and said space between each said primary anode and said cathodic surface.

6. The process of claim 5 further comprising:
said flow rate being from about 1 m/sec to about 4 m/sec.

7. The process of claim 6 further comprising:
said flow rate being from about 1 m/sec to about 2.5 m/sec.

8. The process of claim 2 further comprising:
applying said first current density in a third zone for depositing a metallic encapsulation layer over said dendrites.

9. The process of claim 2 further comprising:
said electrolyte comprising a copper sulfate-sulfuric acid solution;
said first current density applying step comprising applying a first current density in the range of about 0.4 A/cm$^2$ to about 2 A/cm$^2$; and
said superimposing step further comprising applying a second current density in the range of about 1.1 A/cm$^2$ to about 6 A/cm$^2$.

10. The process of claim 9 further comprising:
said first current density being in the range of about 0.75 A/cm$^2$ to about 1.5 A/cm$^2$; and
said second current density being in the range of about 2 A/cm$^2$ to about 3 A/cm$^2$.

11. An apparatus for producing surface treated metal foil, said apparatus comprising:
an electrolytic cell containing an electrolyte having a concentration of metal ions:
a cathodic surface at least partially immersed in said electrolyte;
means for applying a first current density in a first zone for plating a relatively smooth metal foil deposit on said cathodic surface; and
means for superimposing a second current density having a magnitude greater than the limiting current density over said first current density in a second zone, said second current density superimposing means forming a plurality of dendrites on said metal deposit and said first current density applying means plating an additional metal deposit on said metal foil in said second zone for firmly bonding said dendrites to said metal foil.

12. The apparatus of claim 11 further comprising:
said first current density applying means comprising at least one insoluble primary anode in said cell and means for applying a first current to each said primary anode; and
said superimposing means comprising at least one treatment anode embedded in said at least one primary anode and means for applying a second current to said at least one treatment anode simultaneous with the application of said first current to each said primary anode.

13. The apparatus of claim 12 further comprising:
a plurality of treatment anodes embedded in said at least one primary anode.

14. The apparatus of claim 12 further comprising:
means for agitating said electrolyte in said first and second zones.

15. The apparatus of claim 14 further comprising:
at least two primary anodes in said cell, said primary anodes being spaced from said cathodic surface and from each other so as to form at least one fluid passageway; and
said agitating means comprising means for causing said electrolyte to flow at a desired rate through said passageway and said space between each said primary anode and said cathodic surface.

16. The apparatus of claim 12 further comprising:
said at least one primary anode extending beyond said second zone into a third zone; and
said first current applying means causing deposition in said third zone of a metallic encapsulation layer over said dendrites.

17. The apparatus of claim 12 wherein said cathodic surface comprises a rotating drum.

18. The apparatus of claim 17 further comprising:
each said primary anode having an arcuate configuration; and
each said treatment anode being embedded in said at least one primary anode so as to form a substantially continuous surface that does not impede electrolyte flow between the surface of said drum and said substantially continuous surface.

19. The apparatus of claim 12 wherein said first and second current applying means comprise first and second power supplies, said first power supply being separate from said second power supply.

20. The apparatus of claim 13 further comprising:
each said primary anode being spaced from said cathodic surface; and
each said treatment anode being spaced from each adjacent treatment anode by a distance substantially equal to about 1 to about 3 times the spacing between each said primary anode and said cathodic surface.

21. The apparatus of claim 20 further comprising:
said distance being from about 1.0 to about 2.5 times said spacing.

* * * * *